United States Patent
Dai et al.

(10) Patent No.: US 9,325,049 B2
(45) Date of Patent: Apr. 26, 2016

(54) TRANSMISSION LINE AND FILTERING MODULE THEREOF

(71) Applicant: Wistron Corporation, New Taipei (TW)

(72) Inventors: Chih-Sheng Dai, New Taipei (TW); Tien-Kuei Chiang, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 223 days.

(21) Appl. No.: 14/177,173

(22) Filed: Feb. 10, 2014

(65) Prior Publication Data

US 2015/0070102 A1 Mar. 12, 2015

(30) Foreign Application Priority Data

Sep. 10, 2013 (TW) .................................. 102132645

(51) Int. Cl.
*H01P 3/04* (2006.01)
*H03H 1/00* (2006.01)
*H05K 1/02* (2006.01)
*H01R 13/719* (2011.01)
*H03H 7/42* (2006.01)
*H01R 24/58* (2011.01)
*H01R 31/06* (2006.01)

(52) U.S. Cl.
CPC .............. *H01P 3/04* (2013.01); *H03H 1/0007* (2013.01); *H05K 1/0245* (2013.01); *H01R 13/719* (2013.01); *H01R 24/58* (2013.01); *H01R 31/065* (2013.01); *H03H 7/427* (2013.01)

(58) Field of Classification Search
CPC .................... H03H 1/0007; H03H 2001/0028; H03H 7/427; H03H 7/42; H01R 13/719; H05K 1/0245; H01P 3/02; H01P 3/04
USPC ........................................ 333/12, 181, 185, 4
See application file for complete search history.

(56) References Cited

U.S. PATENT DOCUMENTS

| 5,077,543 A * | 12/1991 | Carlile ................. H03H 1/0007 333/167 |
| 2003/0078005 A1* | 4/2003 | Recht ........................ H01F 3/10 333/12 |
| 2004/0085157 A1* | 5/2004 | Richardson ............ H03H 7/427 333/181 |

FOREIGN PATENT DOCUMENTS

TW M334478 6/2008

* cited by examiner

*Primary Examiner* — Benny Lee
*Assistant Examiner* — Albens Dieujuste
(74) *Attorney, Agent, or Firm* — Winston Hsu; Scott Margo (57) ABSTRACT

A transmission line includes a signal terminal for inputting a first signal and a second signal, a first wire coupled to the signal terminal for transmitting the first signal, a second wire coupled to the signal terminal for transmitting the second signal, a filtering module coupled to the first and second wires for receiving the first and second signals to filter out noises of the first and second signal, a third wire coupled to the filtering module for transmitting the first signal, and a fourth wire coupled to the filtering module for transmitting the second signal.

4 Claims, 12 Drawing Sheets

TRANSMISSION LINE AND FILTERING MODULE THEREOF

BACKGROUND OF THE INVENTION

1. Field of the Invention

The present invention relates to a transmission line and filtering module thereof, and more particularly, to a transmission line and filtering module thereof for suppressing conduction and coupling noises without using a ferrite core.

2. Description of the Prior Art

In general, a computer system, such as a personal computer, a television, a mobile phone and so on, can link to peripheral devices, for example, link the computer system to a head-set, a microphone or a television dongle through a transmission line, to expand additional functions.

Also, most governments promulgate related regulations and standard test procedures for ensuring an ElectroMagnetic Compatibility (EMC) between the peripheral devices and the computer system. A radiation emission test is one of test items in the regulations, which is to test whether an operating electric product emits excess electromagnetic waves or noise to interfere with its own or other electronic products' functions.

Figure 1:
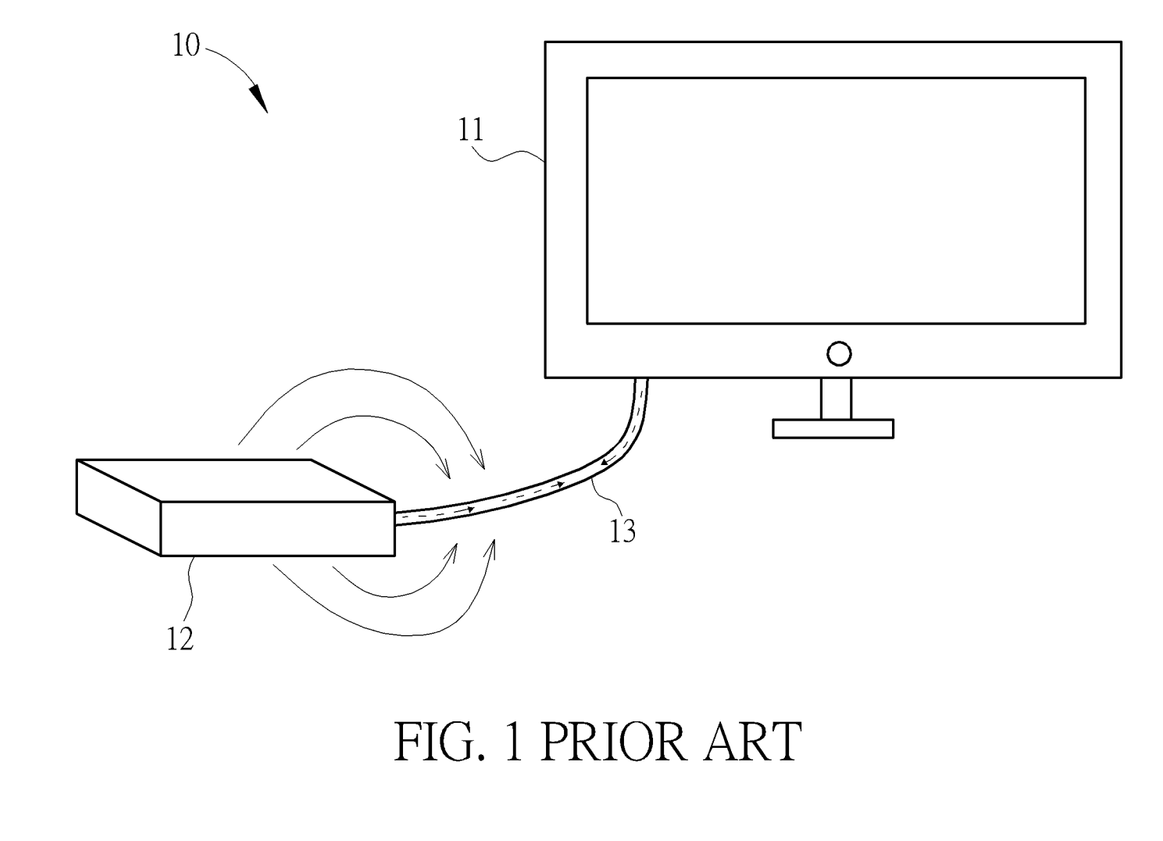
FIG. 1 is a schematic diagram of a computer system 10.

However, despite that the transmission line is normally used for transmitting signals, sometimes it may become a medium for transmitting noises, which causes that the electronic product emits excess noises. Specifically, please refer to FIG. 1, which is a schematic diagram of a computer system 10. The computer system 10 includes a host computer 11 (e.g. television), a peripheral device (e.g. television dongle) and a transmission line 13. When the peripheral device 12 links to the computer system 10 through the transmission line 13, a conduction noise, which is denoted with a dashed line, may propagate between the peripheral device 12 and the host computer 11 through the transmission line 13 at the same time. Or, a space coupling path may be formed by the transmission line 13, such that a coupling noise, which is denoted with a solid line, may be radiated in the air. Traditionally, the conduction noise may be filtered out and suppressed by a filtering circuit disposed on a printed circuit board (PCB) of the peripheral device 12, which may prevent the conduction noise from entering the transmission line 13. On the other hand, the coupling noise may be suppressed by a ferrite core winded around the transmission line 13, wherein the ferrite core is magnetically conductive to form a high-frequency resistor in the air to attenuate a magnetic field intensity of the coupling noise, so as to suppress the coupling noise.

In practice, if the coupling noise is too strong to be suppressed by the filtering circuit disposed on a printed circuit board, only the ferrite core can suppress the coupling noise. However, the ferrite core has some disadvantages such as large sizes and higher costs than the filtering circuit. Meanwhile, the electronic product becomes more and more complicated and the noises may cover a wide frequency range, which results in that the ferrite core cannot suppress the noises in such a wide frequency range.

Therefore, how to provide a signal transmission line for suppressing the conduction and coupling noises without using the ferrite core to reach small sizes and reduce cost, has become a topic in the industry.

SUMMARY OF THE INVENTION

Therefore, it is an objective of the present invention to provide a transmission line and filtering module thereof to solve above mentioned problems.

The present invention discloses a transmission line, comprising a signal terminal for inputting a first signal and a second signal, a first wire coupled to the signal terminal for transmitting the first signal, a second wire coupled to the signal terminal for transmitting the second signal, a filtering module coupled to the first and second wires for receiving the first and second signals to filter out noises of the first and second signal, a third wire coupled to the filtering module for transmitting the first signal; and a fourth wire coupled to the filtering module for transmitting the second signal.

The present invention further discloses a filtering module, utilized in a transmission line, used for filtering out noises of first and second signals transmitted by the transmission line, and comprising a common choke coupled to first, second, third and fourth wires of the transmission line for filtering out common mode noises of the first and second signals, wherein, the common choke is a dual in-line package (DIP) common choke.

The present invention further discloses a filtering module, utilized in a transmission line, used for filtering out noises of first and second signals transmitted by the transmission line, and comprising a common choke coupled to first, second, third and fourth wires of the transmission line for filtering out common mode noises of the first and second signals, and a printed circuit board on which is disposed the common choke, wherein, the common choke is disposed on the printed circuit board through a surface mounting technology.

The present invention further discloses a filtering module, utilized in a transmission line, used for filtering out noises of first and second signals transmitted by the transmission line, and comprising a first differential choke coupled between first and third wires of the transmission line for filtering out a differential mode noise of the first signal, and a second differential choke coupled between second and fourth wires of the transmission line for filtering out a differential mode noise of the second signal, wherein, the first and second differential chokes are dual in-line package (DIP) differential chokes.

The present invention further discloses a filtering module, utilized in a transmission line, used for filtering out noises of first and second signals transmitted by the transmission line, and comprising a first inductor coupled between first and third wires of the transmission line, a second inductor coupled between second and fourth wires of the transmission line, a first capacitor coupled between the first wire and a metallic shield of the transmission line, a second capacitor coupled between the second wire and the metallic shield the transmission line, and a printed circuit board on which is disposed the first and second inductors and the first and second capacitors, wherein, the first inductor and the first capacitor are used for filtering out a differential mode noise of the first signal, and the second inductor and the second capacitor are used for filtering out a differential mode noise of the second signal.

The present invention further discloses a filtering module, utilized in a transmission line, used for filtering out noises of first and second signals transmitted by the transmission line, and comprising a first capacitor including a first end coupled to first and third wires of the transmission line, and a second end coupled to second and fourth wires of the transmission line, a second capacitor including a first end coupled to the first and third wires of the transmission line, and a second end coupled to a metallic shield of the transmission line, a third capacitor including a first end coupled to the second and fourth wires of the transmission line, and a second end coupled to the metallic shield of the transmission line, and a printed circuit board on which is disposed the first, second and third capacitors, wherein, the first capacitor is used for filtering out differential mode noises of the first and second signals, and the second and third capacitor are used for filtering out common mode noises of the first and second signals.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
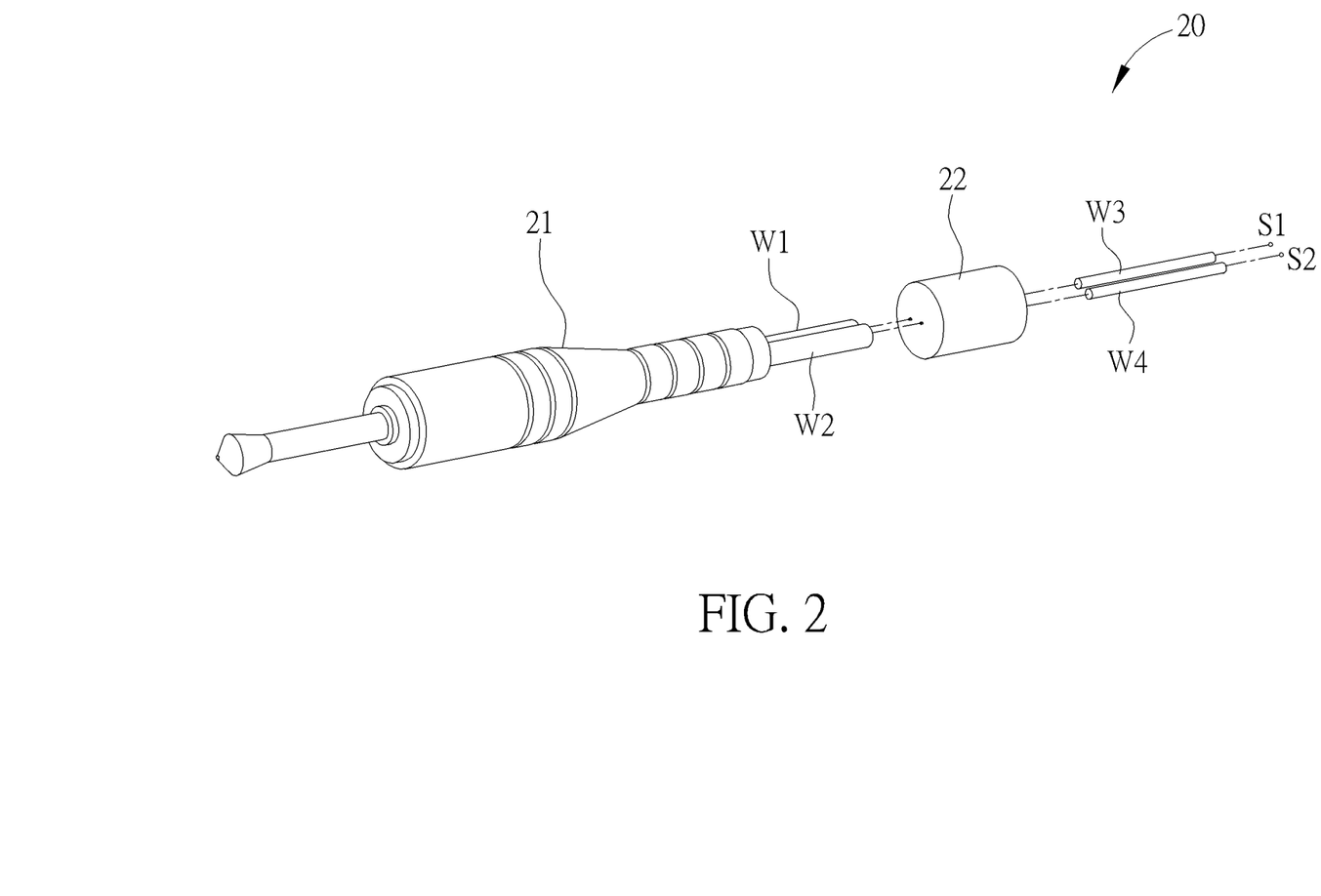
FIG. 2 is a schematic diagram of a transmission line 20 according to an embodiment of the present invention.

Please refer to FIG. 2, which is a schematic diagram of a transmission line 20 according to an embodiment of the present invention. The transmission line 20 may replace the transmission line 13 shown in FIG. 1, and can suppress both of coupling and conduction noises without using a ferrite core, such that the transmission line may be miniaturized and have lower costs. The transmission line 20 includes a signal terminal 21, wires W1, W2, W3 and W4 and a filtering module 22. The transmission line 20 may be any kind of transmission line for transmitting two distinct signals S1 and S2, e.g. a power line, an audio cable, an Internet cable and so on, such that the host computer 11 and the peripheral device 12 communicate with each other through the transmission line 20. The wires W1 and W3 are used for transmitting the signal S1, and the wires W2 and W4 are used for transmitting the signal S2. The signal terminal 21 is coupled to the wire W1 and W2 for inputting the signals S1 and S2. The filtering module 22 is coupled to the wires W1, W2, W3 and W4 for filtering out noises of the signals S1 and S2.

In this embodiment, the signal terminal 21 is preferably coupled to the peripheral device 12, and the filtering module 22 is preferably located close to the peripheral device 12, thereby the filtering module 22 may attenuate the noises of the signals S1 and S2 entering from the peripheral device 12 to the transmission line 20 to reduce radiation intensities of the noises and block the space coupling path. In such a structure, the filtering module 22 is mainly but not limited to suppressing the noise from the peripheral device 12. Unlimitedly, a designer may adjust a location of the filtering module 22 on the transmission line 20 according to practical requirements. For example, if it is verified that the noises of the signals S1 and S2 are originated from the computer system 11, the filtering module 22 may be located close to the computer system 11 for suppressing the noise from the computer system 11.

Noticeably, the noises of the signals S1 and S2 may be a common mode noise having a same direction and originated from a same source, or a differential mode noise originated from different sources (i.e. an interference between the signals S1 and S2). Meanwhile, considering a size and a production cost of the filtering module 22, a structure of the filtering module 22 may be properly adjusted and designed to suppress the noises having different modes, and meet the requirements of the size and production cost.

Figure 3:
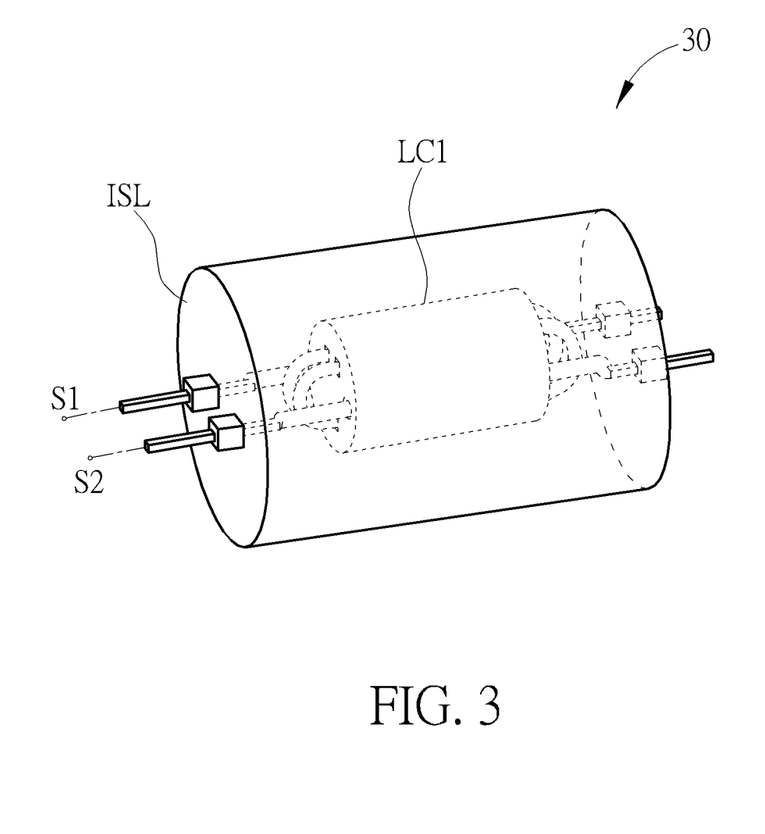
FIG. 3 to FIG. 8 are schematic diagrams of filtering modules according to first to sixth embodiments of the present invention embodiment.
Figure 4:
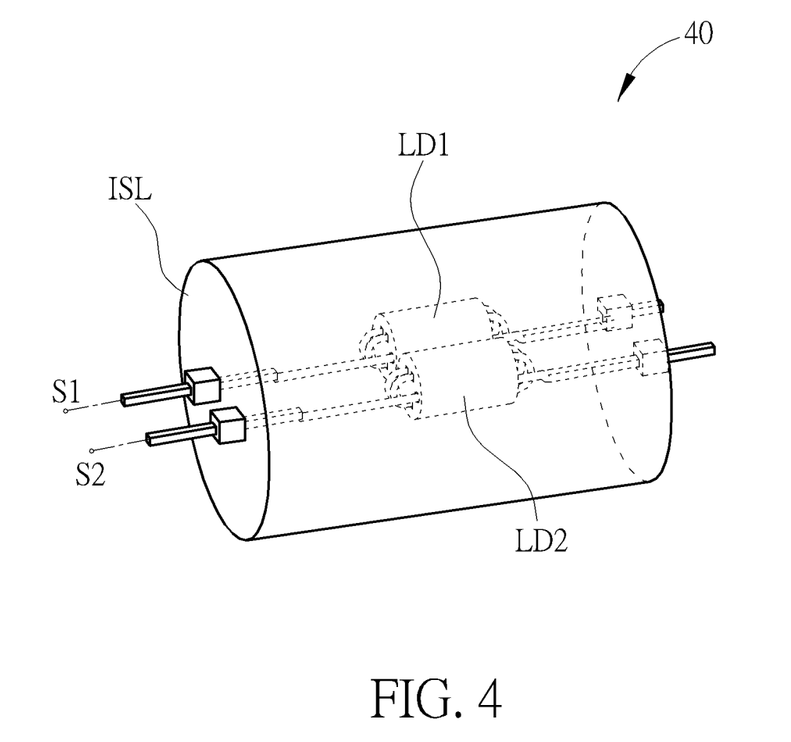

Please refer to FIG. 3 to FIG. 8, which are schematic diagrams of filtering modules 30, 40, 50, 60, 70 and 80 according to first to sixth embodiments of the present invention embodiment. The filtering modules 30-80 may realize but not limit the filtering module 22. The filtering modules 30 and 40 shown in FIG. 3 and FIG. 4 are realized by dual in-line package (DIP) elements, which may be implemented independently (unnecessary to attach a printed circuit board) for easy manufacturing. The filtering modules 50-80 shown in FIG. 5 to FIG. 8 are realized by surface mounting technology (SMT) elements, wherein such SMT elements require attachment to a printed circuit board, and have smaller sizes than the DIP elements for implementing in miniaturized products.

In detail, regarding the first embodiment shown in FIG. 3, the filtering module 30 includes a common choke LC1 having four ends respectively coupled to the wires W1, W2, W3 and W4. The common choke LC1 is used for filtering out common mode noises of the signals S1 and S2, which is preferably a DIP common choke. When the common mode noises of the signals S1 and S2 enter the common choke LC1, the common choke LC1 may respectively induce magnetic flux having a same intensity and opposite directions on signal paths of the signals S1 and S2, which may cancel the common mode noises of the signals S1 and S2.

Regarding the second embodiment shown in FIG. 4, the filtering module 40 includes differential chokes LD1 and LD2. The differential choke LD1 is coupled between the wires W1 and W3, and the differential choke LD2 is coupled between the wires W2 and W4. The differential chokes LD1 and LD2 are used for respectively filtering out the differential mode noises of the signals S1 and S2, which are preferably DIP differential chokes. When the differential mode noises of the signals S1 and S2 enter the differential chokes LD1 and LD2, the differential chokes LD1 and LD2 may respectively induce magnetic flux having a same intensity and opposite directions on signal paths of the signals S1 and S2, which may cancel the differential mode noises of the signals S1 and S2.

Figure 5:
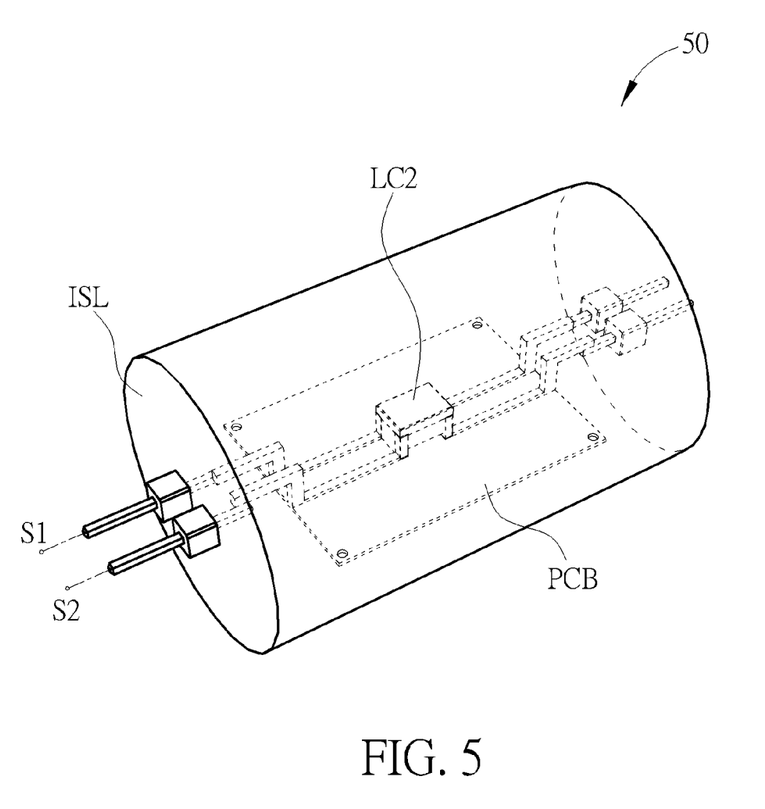

Regarding the third embodiment shown in FIG. 5, the filtering module 50 includes a common choke LC2 and a printed circuit board PCB. The filtering module 30 functions similarly to the filtering module 50 for filtering out the common mode noises of the signals S1 and S2 but uses different electronic elements and manufacturing processes. Specifically, the common choke LC2 is preferably disposed on the printed circuit board PCB by the SMT process. Layout or signal traces on the printed circuit board PCB should be preferably designed according to the coplanar waveguide (CPW) principle to match characteristic impedances of the transmission line 20, which may avoid generating additional noises due to the signals S1 and S2 encountering discontinuous impedances when flowing through the filtering module 50. In addition, a size of the common choke LC2 is smaller than a size of the common choke LC1 shown in FIG. 3, such that the filtering module 50 is smaller to be applied in small electronic products for filtering out the noises.

Figure 6:
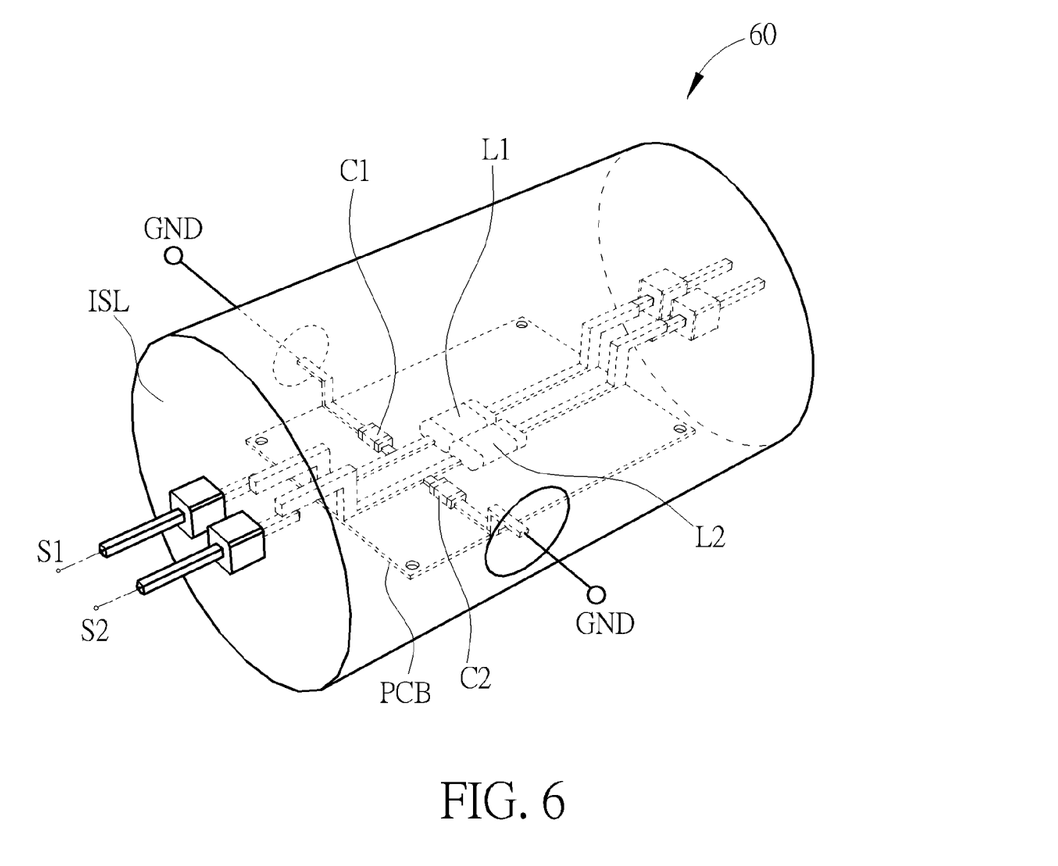

Regarding the fourth embodiment shown in FIG. 6, the filtering module 60 further coupled to a metallic shield GND of the transmission line 20. Different from the first to third embodiments, the filtering module 60 is designed based on an inductor-capacitor filtering circuit. The filtering module 60 includes inductors L1 and L2 and capacitors C1 and C2. In detail, the inductor L1 is coupled between the wires W1 and W3, the inductor L2 is coupled between the wires W2 and W4, the capacitor C1 is coupled between the wire W1 and the metallic shield GND, the capacitor C2 is coupled between the wire W2 and the metallic shield GND. The inductor L1 and the capacitor C1 may form a low pass filter for filtering out the differential mode noise of the signal S1. Likewise, the inductor L2 and the capacitor C2 may form another low pass filter for filtering out the differential mode noise of the signal S2. The designer may select proper inductances and capacitances of the inductors L1 and L2 and the capacitors C1 and C2 to reach proper cut-off frequencies of the two low pass filters, such that the signal S1 having a frequency lower than the cut-off frequency may pass filtering module 60 and the noise having a frequency higher than the cut-off frequency is guided to the metallic shield GND by the capacitor C1. As a result, the filtering module 60 not only filters out the noise, but also guides the noise to the metallic shield GND, so as to reach better noise suppression.

Figure 7:
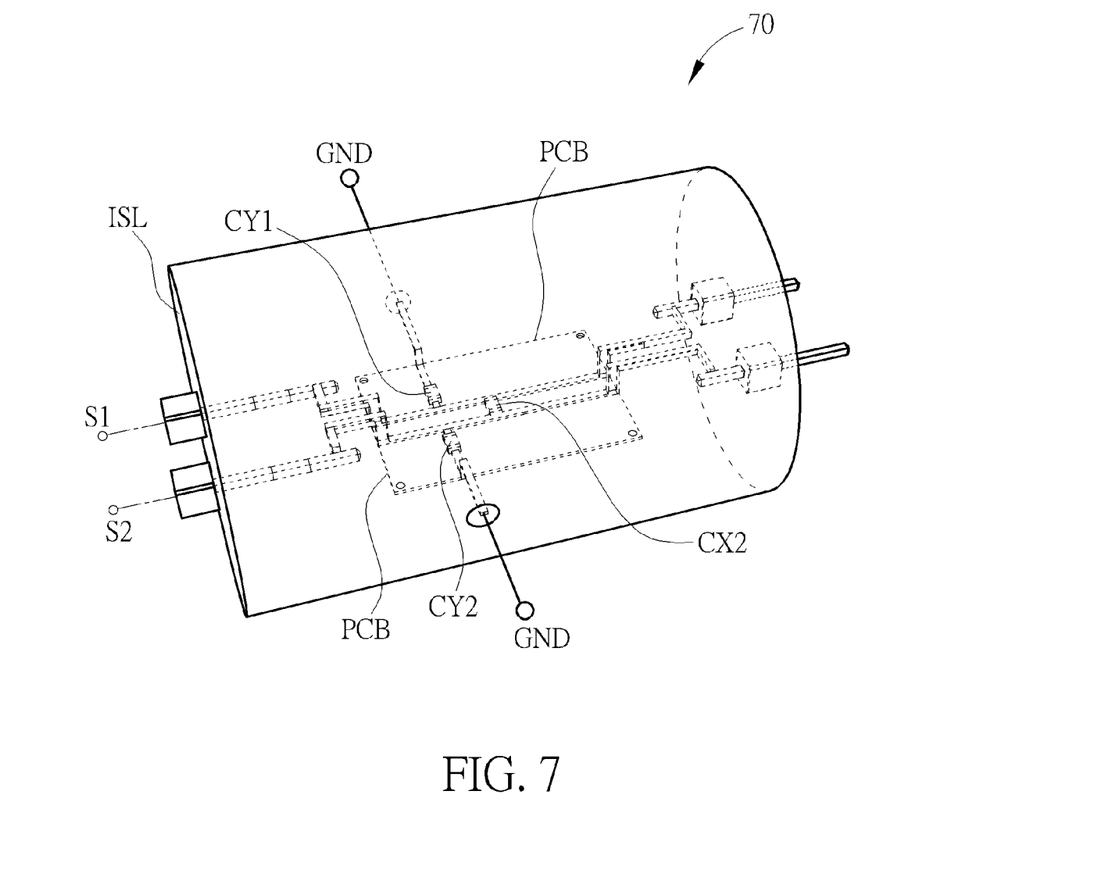

Regarding the fifth embodiment shown in FIG. 7, the filtering module 70 is designed based on an X-capacitor and a Y-capacitor. The filtering module 70 includes capacitors CX2, CY1 and CY2, wherein the capacitors CY1 and CY2 may be regarded as the Y-capacitors which are located at the same locations as shown in FIG. 6. While the capacitor CX2 may be regarded as the X-capacitor, the capacitor CX2 includes one end coupled to the wires W1 and W3, and another end coupled to the wires W2 and W4. Specifically, the capacitor CX2 is coupled between the signals S1 and S2 to prevent the signals S1 and S2 from interfering with each other, which functions like filtering out the differential mode noises. While the capacitors CY1 and CY2 are used for filtering out the common mode noises of the signals S1 and S2 and guide the high-frequency noise to the metallic shield GND.

Figure 8:
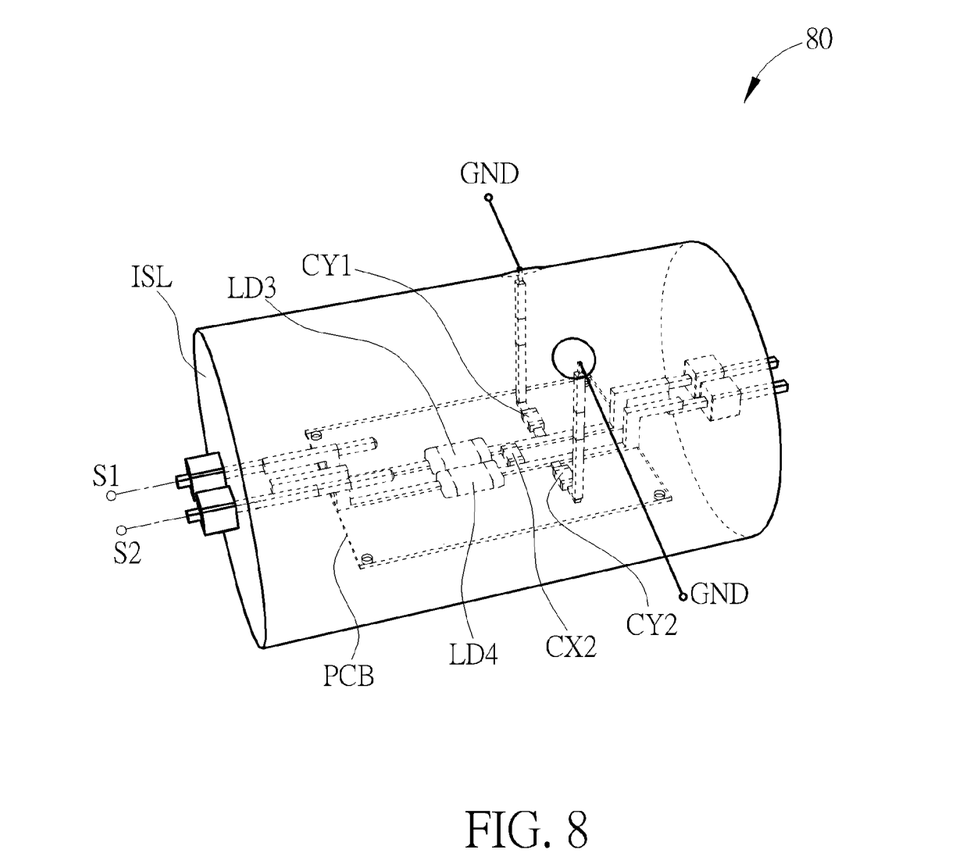

Regarding the sixth embodiment shown in FIG. 8, the filtering module 80 is designed based on a resistor-capacitor (RC) filtering circuit. The filtering module 80 includes the capacitors CX2, CY1 and CY2, and ferrite beads LD3 and LD4. The ferrite bead L3 includes one end coupled to the wire W1, and another end coupled to the wire W3. The ferrite bead L4 includes one end coupled to the wire W2, and another end coupled to the wire W4. The ferrite beads LD3 and LD4 are respectively used for filtering out the differential mode noises of the signals S1 and S2. In such a structure, the filtering module 80 may suppress the differential mode noises by the ferrite beads LD3 and LD4 and the capacitor CX2. In addition, characteristic impedance of the ferrite beads LD3 and LD4 and a capacitance of the capacitor CX2 may be properly selected to adjust a filtering bandwidth of the filtering module 80 for filtering out the noise.

In the first to sixth embodiments, all of the filtering modules 30, 40, 50, 60, 70 and 80 have an insulation jacket ISL for covering elements of the filtering modules to protect the filtering module from contact with air and damage by external forces.

Therefore, as can be seen from the above embodiments, the transmission line of the present invention is equipped with the filtering module for filtering out one or two of the common and differential mode noises, which may avoid the conduction noise from flowing through the transmission line and reduce the radiation intensity of the coupling noises and block the space coupling path. Since elements included in the filtering module may associate to manufacturing and assembly processes, modes and bandwidths of the noises, the designer may choose a proper filtering module from the above embodiments according to practical requirements to apply in the transmission line, so as to reach different noise suppression results.

Figure 9:
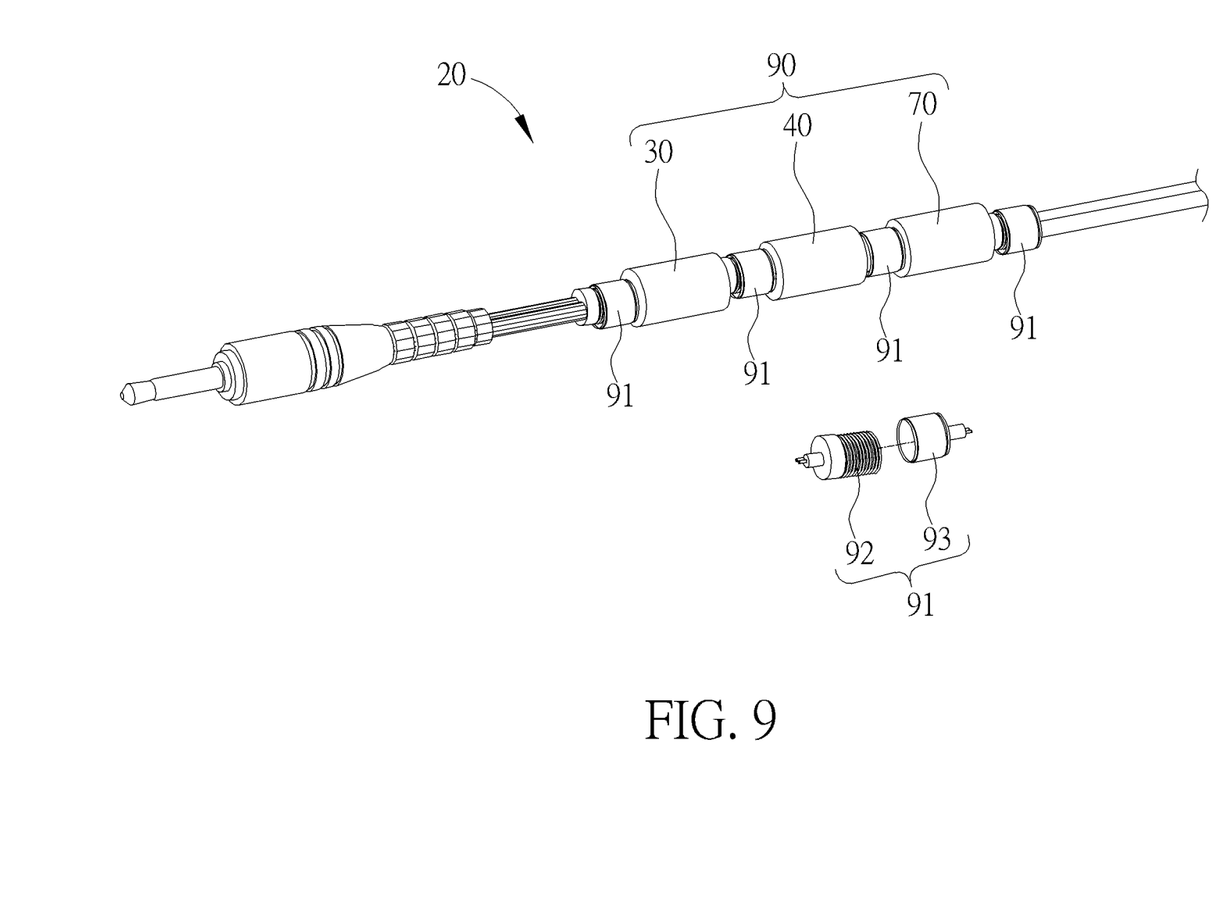
FIG. 9 and FIG. 10 respectively illustrate an appearance and an equivalent circuit of a composite filtering module shown in FIG. 9 according to an embodiment of the present invention.

Please note that it is feasible to cascade more of the filtering modules 30, 40, 50, 60, 70 and 80 together to form a composite filtering module in order to broaden functions of the filtering module to suppress different types of the noises and corresponding bandwidths. For example, please refer to FIG. 9 and FIG. 10, which respectively illustrate an appearance and an equivalent circuit of a composite filtering module 90 according to an embodiment of the present invention. As shown in FIG. 9, the composite filtering module 90 is a combination of the filtering modules 30, 40 and 70, thereby the composite filtering module 90 has filtering functions of the filtering modules 30, 40 and 70 for filtering out the noises of the signals S1 and S2, i.e. the common mode noises, the differential mode noises and the high-frequency noises, so as to reach better noise suppression.

The transmission line 20 illustrated in FIG. 9 further includes a plurality of connectors 91 for respectively connecting the wires W1 and W2 to the filtering module 30, connecting the filtering modules 30 and 40, connecting the filtering modules 40 and 70, and connecting the filtering module 70 to the wires W3 and W4. Therefore, the signals S1 and S2 may be transmitted from the wires W1 and W2, the filtering modules 30, 40 and 70, and finally to the wires W3 and W4. The connectors 91 are able to be fastened and unfastened, such that the filtering modules 30, 40 and 70 are replaceable from the transmission line 20. The connector 91 is preferably a SubMiniature version A (SMA) connector composed of a pair of connecting units 92 and 93. In such a structure, the designer may cascade multiple filtering modules together to implement in the transmission line 20 or replace one of the multiple filtering modules from the transmission line 20 according to practical requirements, which may broaden an operation of the filtering module to suppress different modes and bandwidths of the noises and provides flexibility for implementation.

Figure 10:
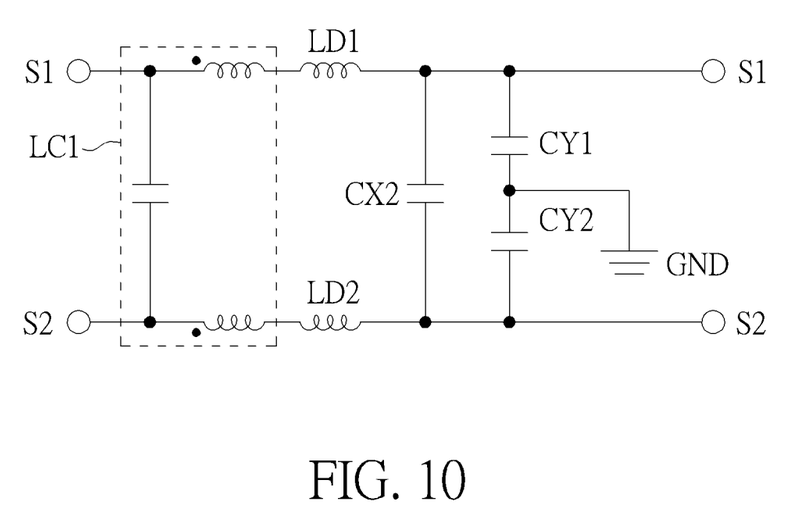

The equivalent circuit of the composite filtering module 90 is shown in FIG. 10, the designer may adjust electrical parameters (e.g. impedances, inductances and capacitance) of the elements included in the composite filtering module 90 to adjust an operation of the composite filtering module 90 to suppress different modes and bandwidths of the noises. Or, the designer may also adjust an order of the cascaded filtering modules 30, 40 and to adjust a structure of the equivalent circuit, which provides flexibility for implementation as well.

Figure 11:
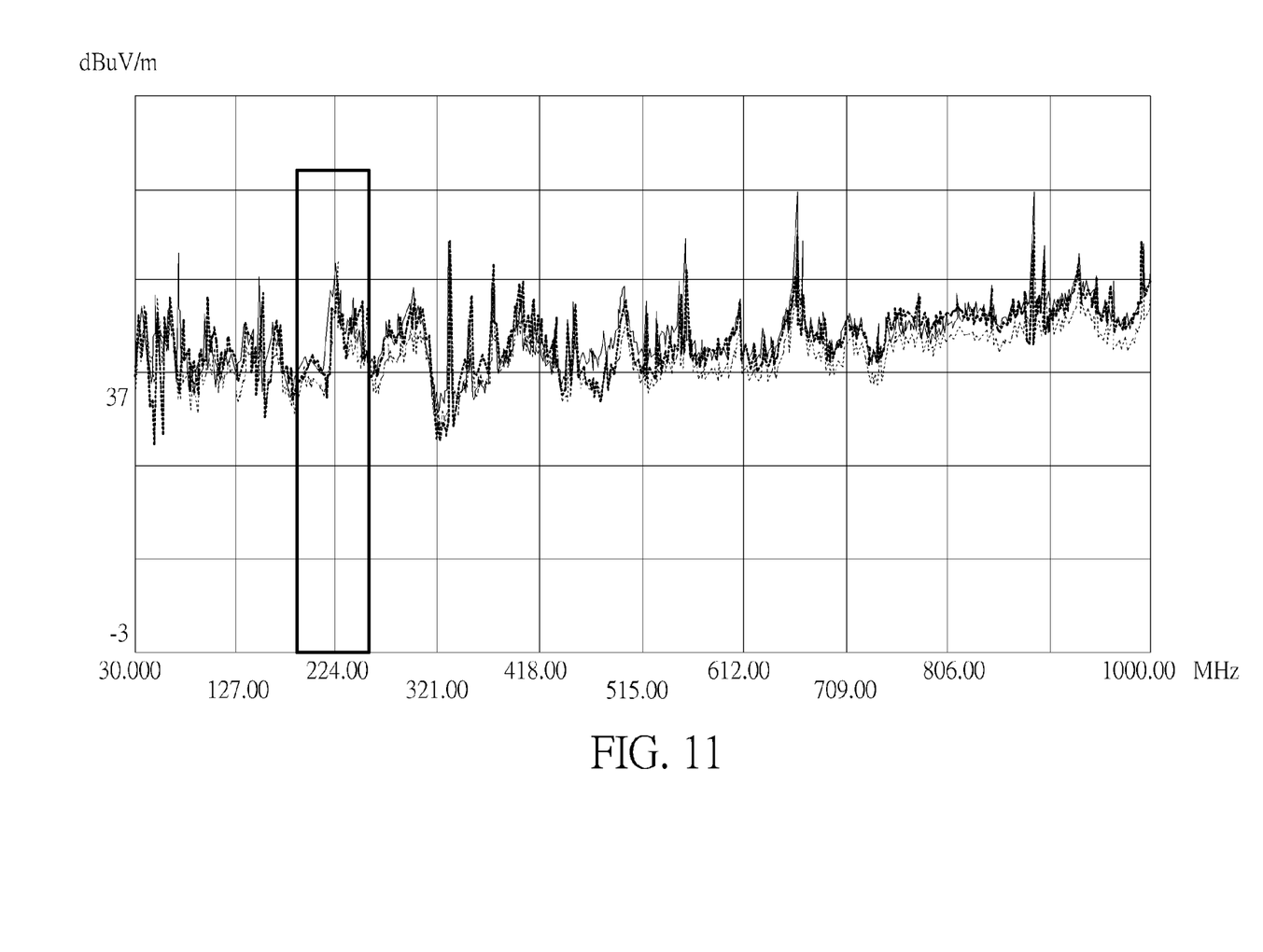
FIG. 11 and FIG. 12 are respectively schematic diagrams of interference testing results of the computer system shown in FIG. 1 along horizontal and vertical polarized sections.
Figure 12:
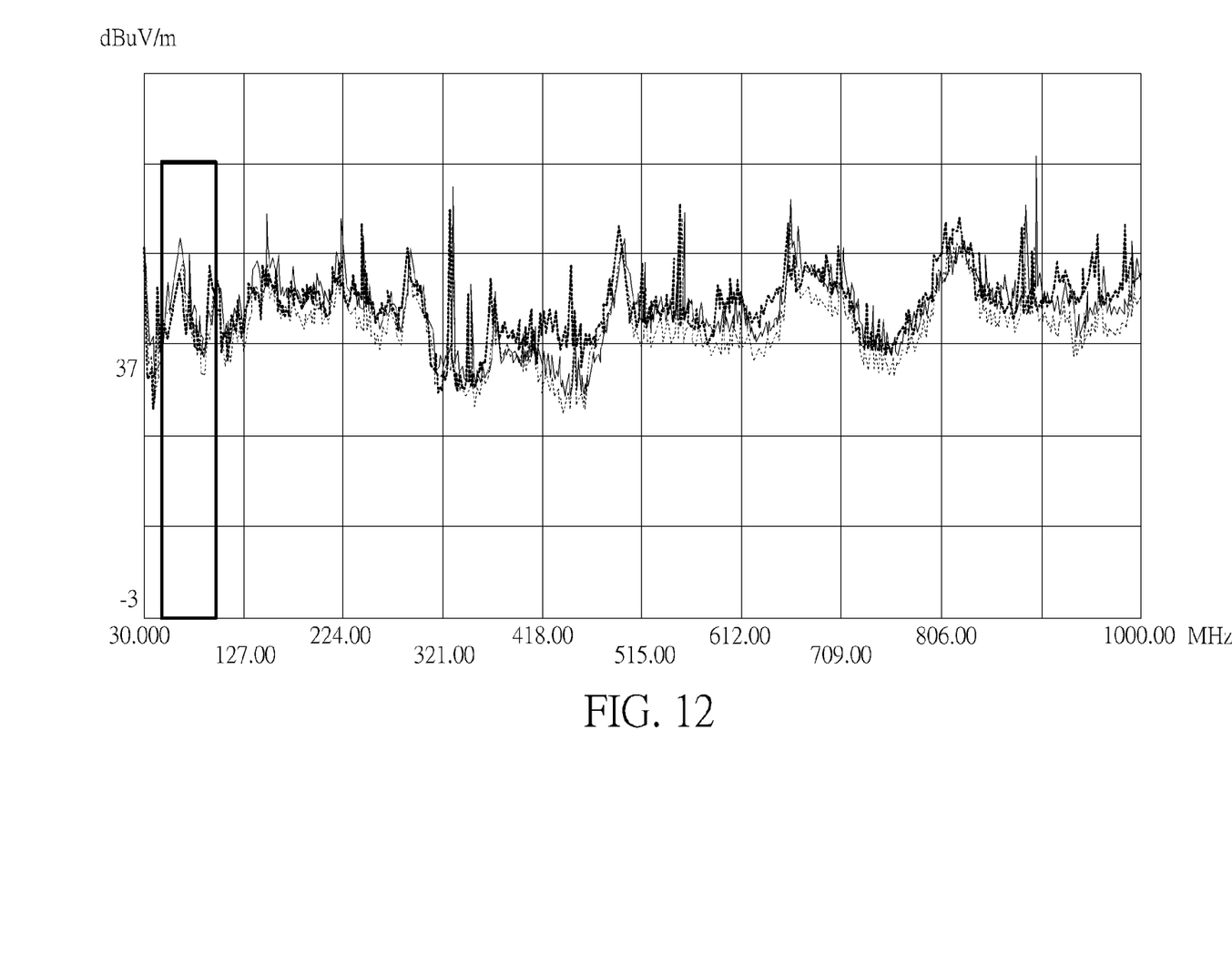

Please refer to FIG. 11 and FIG. 12, which are respectively schematic diagrams of interference testing results of the computer system 10 along horizontal and vertical polarized sections. There are three test conditions as below:

Condition one: the transmission line 13 is not equipped with the composite filtering module 90, which is denoted with thin-solid-line;

Condition two: a printed circuit board of the peripheral device 12 is equipped with a filtering module to suppress the conduction noise, which is denoted with a dashed-line;

Condition three: the transmission line 20 is equipped with the composite filtering module 90, which is denoted with bold-solid line.

The following Table 1 illustrates test data for FIG. 11 and FIG. 12:

| Frequency | Horizontal/Vertical Radiation Intensity (dBuV/m) | | | |
|---|---|---|---|---|
| (MHz) | Condition One | Condition Two | Condition Three | Limit |
| 73.65 | 40.50/42.04 | 41.00/42.54 | 37.50/37.04 | <40/<40 |
| 222.06 | 42.69/41.28 | 42.19/41.78 | 37.50/37.78 | <40/<40 |

As can be seen from FIG. 11 and FIG. 12, under the condition that the peripheral device 12 is equipped with the filtering module to suppress the conduction noise (i.e. condition two), the radiation intensity of the computer system 10 exceeds the limit. In a low-frequency test range (i.e. 73.65 MHz), test results under the Conditions one and two are substantially around 40-42 dBuV/m, in a high-frequency test range (i.e. 222.06 MHz), test results under Condition one and two are substantially around 41-42 dBuV/m. In comparison, under the condition that the transmission line 20 is equipped with the composite filtering module to suppress the conduction and coupling noises (i.e. Condition three), the radiation intensity of the computer system 10 can be effectively reduced both in the high-frequency and low-frequency test ranges, the radiation intensity of the computer system 10 may be reduced to around 37 dBuV/m. Thus, the composite filtering module of the present invention may effectively suppress the coupling noise and the conduction noise to reduce the radiation intensity of the computer system 10, so as to meet the requirements of the radiation emission test.

To sum up, the transmission line of the present invention is equipped with a filtering module for filtering out one or two of the common and differential mode noises, which may attenuate the noises when the signals S1 and S2 enter the transmission line 20 from the peripheral device 12 to reduce a radiation intensity of the noises and block the space coupling path. Since elements included in the filtering module may associate to manufacturing and assembly processes, modes and bandwidths of the noises, the designer may choose a proper filtering module from the above embodiments according to practical requirements to apply in the transmission line, so as to reach different noise suppression results. In addition, it is also feasible to cascade multiple filtering modules together to form a composite filtering module in order to broaden functions of the filtering module to suppress different types of the noises and corresponding bandwidths.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transmission line, comprising:
   a signal terminal for inputting a first differential signal and a second differential signal;
   a first wire coupled to the signal terminal for transmitting the first differential signal;
   a second wire coupled to the signal terminal for transmitting the second differential signal;
   a filtering module coupled to the first and second wires for receiving the first and second signals to filter out noises of the first and second differential signals;
   a third wire coupled to the filtering module for transmitting the first differential signal; and
   a fourth wire coupled to the filtering module for transmitting the second differential signal;
   wherein the filtering module comprises:
      a first differential choke coupled between the first and third wires for filtering out a differential mode noise of the first differential signal; and
      a second differential choke coupled between the second and fourth wires for filtering out a differential mode noise of the second differential signal;
      wherein, the first and second differential chokes are dual in-line package (DIP) differential chokes.

2. The transmission line of claim 1, wherein the filtering module comprises an insulation jacket.

3. A filtering module, utilized in a transmission line, used for filtering out noises of first and second differential signals transmitted by the transmission line, and comprising:
   a first differential choke coupled between first and third wires of the transmission line for filtering out a differential mode noise of the first differential signal; and
   a second differential choke coupled between second and fourth wires of the transmission line for filtering out a differential mode noise of the second differential signal;
   wherein, the first and second differential chokes are dual in-line package (DIP) differential chokes.

4. The filtering module of claim 3, further comprising an insulation jacket.

\* \* \* \* \*